US009063434B2

(12) United States Patent
Menon et al.

(10) Patent No.: US 9,063,434 B2
(45) Date of Patent: Jun. 23, 2015

(54) SUB-DIFFRACTION-LIMITED PATTERNING AND IMAGING VIA MULTI-STEP PHOTOSWITCHING

(71) Applicant: University of Utah Research Foundation, Salt Lake City, UT (US)

(72) Inventors: Rajesh Menon, Salt Lake City, UT (US); Precious Cantu, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 14/152,720

(22) Filed: Jan. 10, 2014

(65) Prior Publication Data

US 2014/0199636 A1   Jul. 17, 2014

Related U.S. Application Data

(60) Provisional application No. 61/751,599, filed on Jan. 11, 2013.

(51) Int. Cl.
*G03F 7/20* (2006.01)
*G03F 7/00* (2006.01)
(Continued)

(52) U.S. Cl.
CPC ............ *G03F 7/7045* (2013.01); *G03F 7/0035* (2013.01); *G03F 7/0045* (2013.01); *G03F 7/0395* (2013.01)

(58) Field of Classification Search
CPC ... G03F 7/7045; G03F 7/0035; G03F 7/0045; G03F 7/0395; G03F 7/2022
USPC ................................................ 430/322, 325
See application file for complete search history.

(56) References Cited

U.S. PATENT DOCUMENTS 7,535,012 B2   5/2009   Betzig et al.
7,666,580 B2   2/2010   Menon et al.
(Continued)

FOREIGN PATENT DOCUMENTS

EP          2653903 A1     10/2013
WO    WO 2013/090360 A2    6/2013

OTHER PUBLICATIONS

Andrew et al.; Confining Light to Deep Subwavelength Dimensions to Enable Optical Nanopatterning; Science; May 15, 2009; pp. 917-921; vol. 324, No. 5929; American Association for the Advancement of Science.
(Continued)

*Primary Examiner* — Brittany Raymond
(74) *Attorney, Agent, or Firm* — Thorpe North & Western, LLP

(57) ABSTRACT

Sub-diffraction-limited patterning using a photoswitchable recording material is disclosed. A substrate can be provided with a photoresist in a first transition state. The photoresist can be configured for spectrally selective reversible transitions between at least two transition states based on a first wavelength band of illumination and a second wavelength band of illumination. An optical device can selectively expose the photoresist to a standing wave with a second wavelength in the second wavelength band to convert a section of the photoresist into a second transition state. The optical device or a substrate carrier securing the substrate can modify the standing wave relative to the substrate to further expose additional regions of the photoresist into the second transition state in a specified pattern. The method can further convert one of the first and second transition states of the photoresist into an irreversible transition state, while the other of the first and second transition states remains in a reversible transition state. The photoresist can be developed to remove the regions of the photoresist in the irreversible transition state.

11 Claims, 16 Drawing Sheets

(51) Int. Cl.
*G03F 7/004* (2006.01)
*G03F 7/039* (2006.01)

(56) References Cited

U.S. PATENT DOCUMENTS

| | | | |
|---|---|---|---|
| 7,667,819 | B2 | 2/2010 | Menon et al. |
| 7,713,684 | B2 | 5/2010 | Menon et al. |
| 7,714,988 | B2 | 5/2010 | Menon et al. |
| 7,989,151 | B2 | 8/2011 | Menon |
| 8,076,125 | B2 | 12/2011 | McGlimpsey |
| 8,143,601 | B2 | 3/2012 | Menon et al. |
| 8,148,762 | B2 | 4/2012 | Joe et al. |
| 8,339,597 | B2 | 12/2012 | Dal Negro et al. |
| 8,445,867 | B2 | 5/2013 | Selvin et al. |
| 8,552,402 | B2 | 10/2013 | Ye et al. |
| 8,564,792 | B2 | 10/2013 | Zhuang et al. |
| 2010/0248159 | A1 | 9/2010 | Menon et al. |
| 2011/0037846 | A1 | 2/2011 | Huang et al. |
| 2012/0325200 | A1 | 12/2012 | Kolpak et al. |
| 2013/0001436 | A1 | 1/2013 | Zhuang et al. |

OTHER PUBLICATIONS

Bates et al.; Multicolor Super-resolution Imaging with Photo-switchable Fluorescent Probes; Science; Sep. 21, 2007; pp. 1749-1753; vol. 317, No. 5845; American Association for the Advancement of Science.

Bates et al.; Super-resolution imaging by nanoscale localization of photo-switchable fluorescent probes; Current Opinion in Chemical Biology; Oct. 2008; pp. 505-514; vol. 12, No. 5; Elsevier Ltd.

Brimhall et al.; Breaking the Far-Field Diffraction Limit in Optical Nanopatterning via Repeated Photochemical and Electrochemical Transitions in Photochromic Molecules; Physical Review Letters; Nov. 11, 2011; pp. 205501-1-205501-5; vol. 107; American Physical Society.

Rust et al.; Sub-diffraction-limit imaging by stochastic optical reconstruction microscopy (STORM); Nature Methods; Aug. 2006; pp. 793-796; vol. 3; Nature Publishing Group.

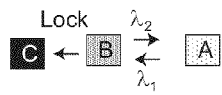
110. Start with Subtrate in Form B
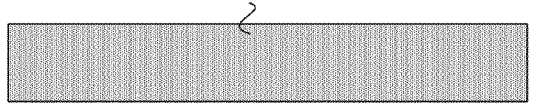
FIG. 1A
112. Expose to Standing Wave at $\lambda_2$
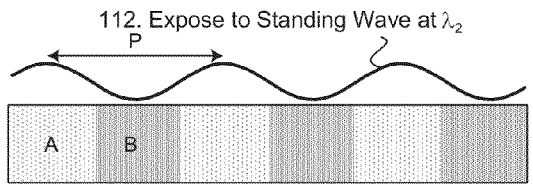
FIG. 1B
114. Shift Standing Wave (or Sample) to Right (or Left) by and $\Delta_1$ Re-expose
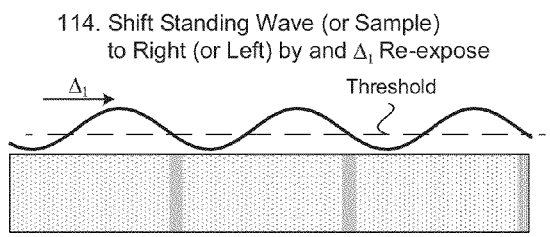
FIG. 1C
116. Lock Form B to Form C
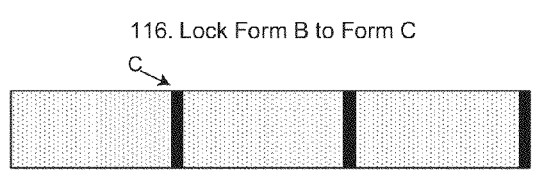
FIG. 1D
118. Uniform Exposure to $\lambda_1$
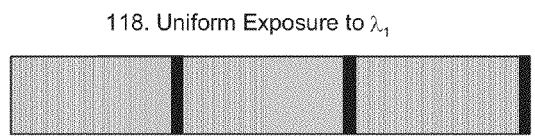
FIG. 1E
120. Expose to Standing Wave at $\lambda_2$
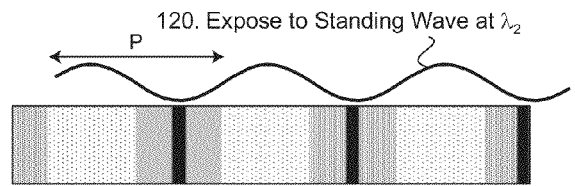
FIG. 1F
122. Shift Standing Wave (or Sample) to Right (or Left) by and $\Delta_2$ Re-expose
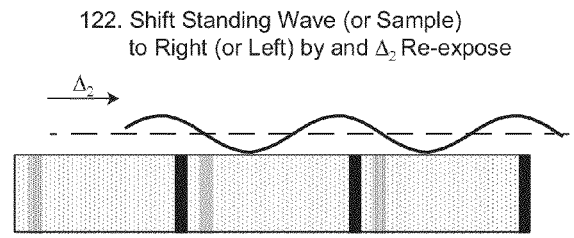
FIG. 1G
124. Lock Form B to Form C
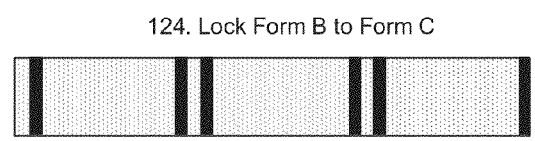
FIG. 1H
126. Repeat Steps 120-124
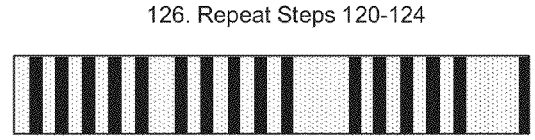
FIG. 1I
128. Develop
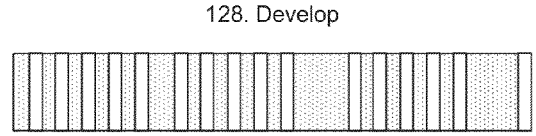
FIG. 1J

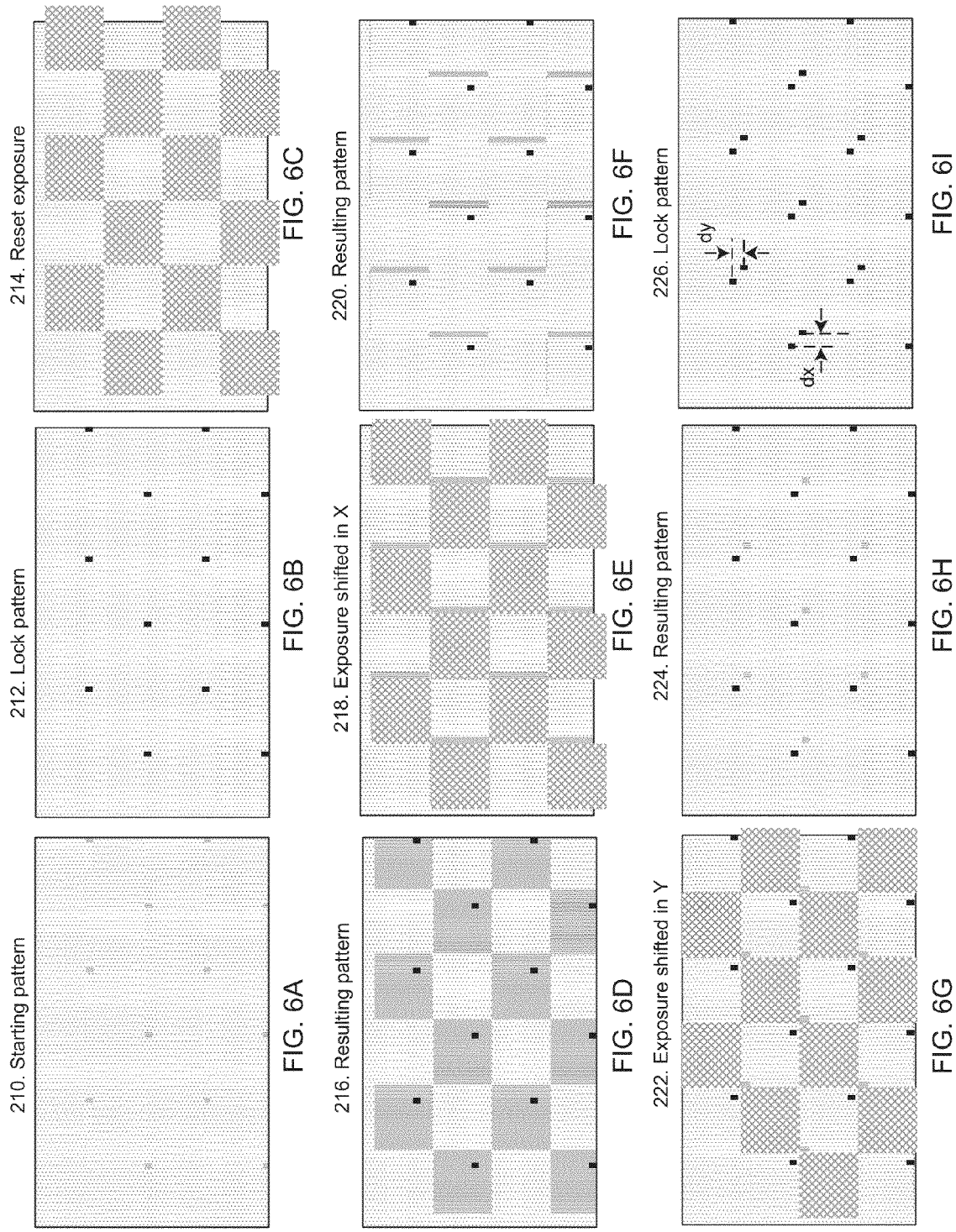

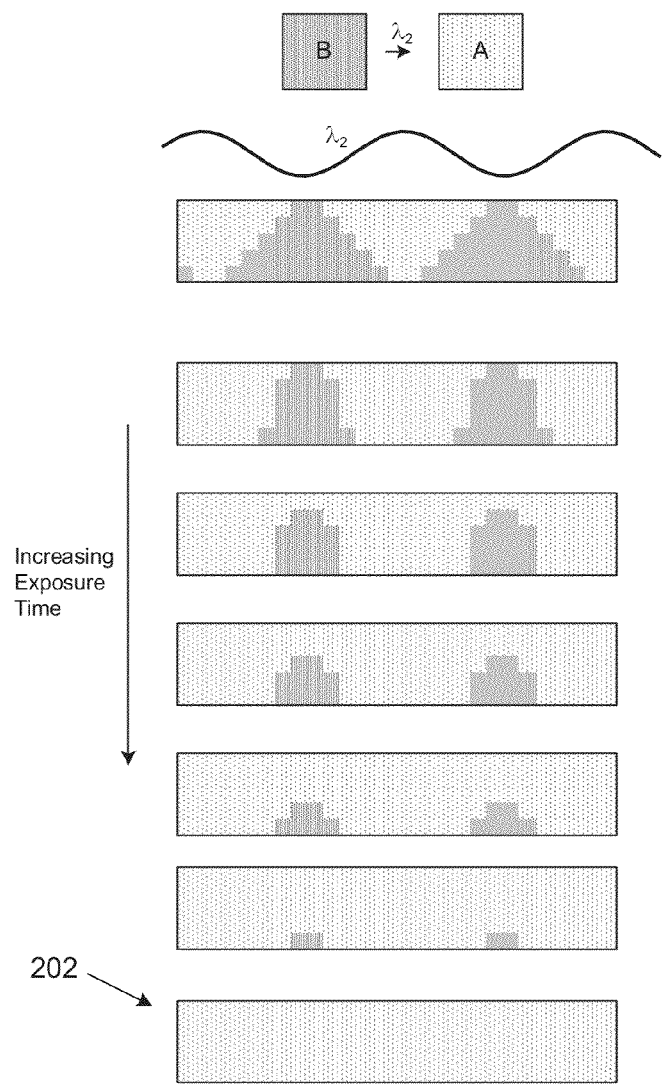
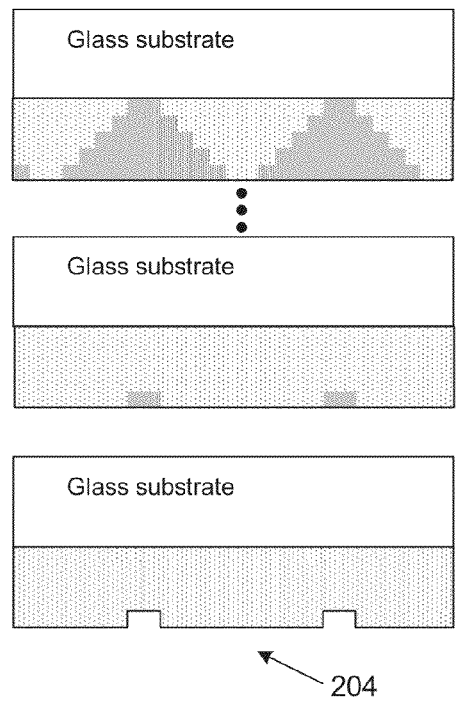
FIG. 7A
FIG. 7B

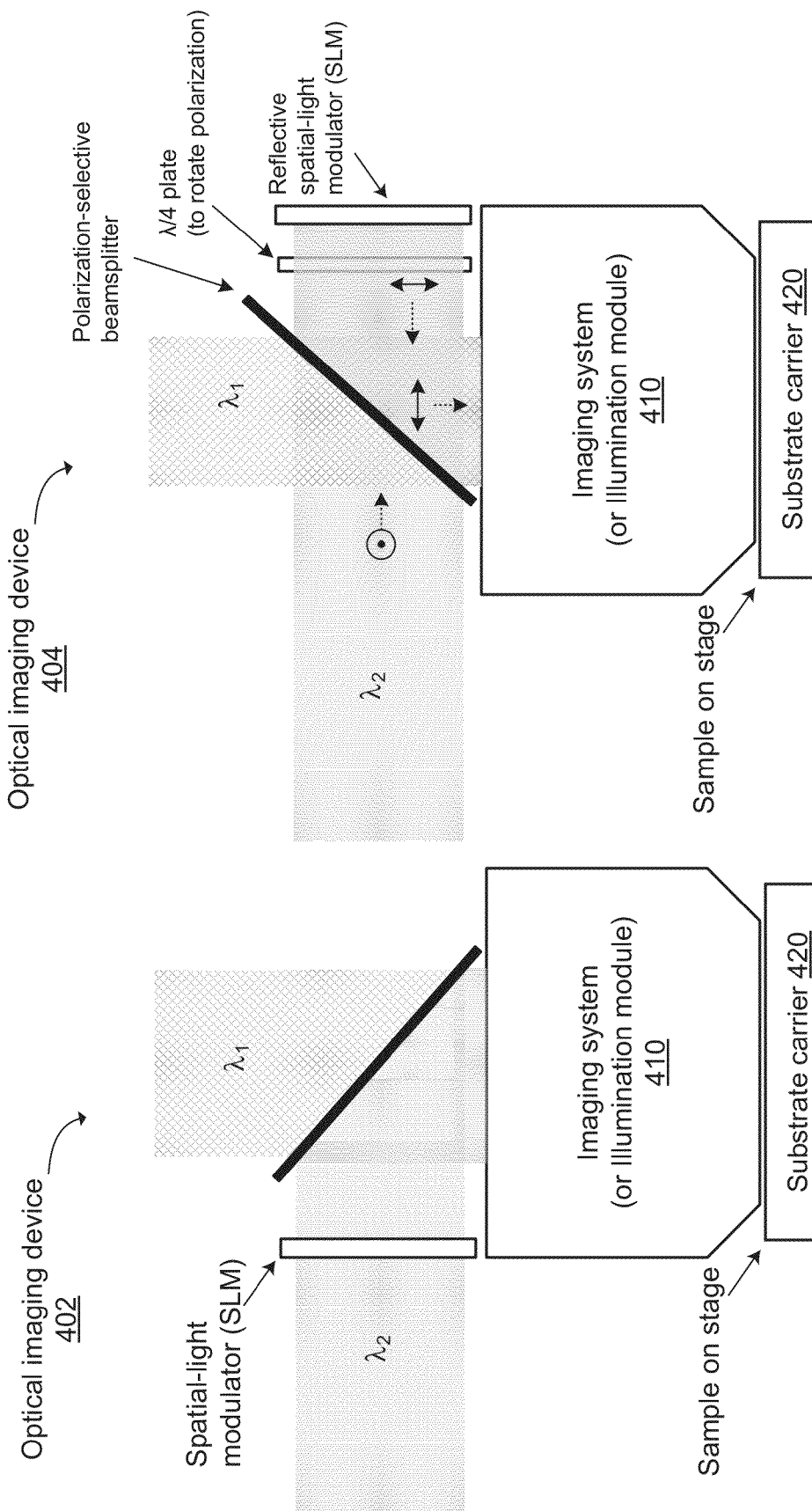

SUB-DIFFRACTION-LIMITED PATTERNING AND IMAGING VIA MULTI-STEP PHOTOSWITCHING

RELATED APPLICATIONS

This application claims the benefit of and hereby incorporates by reference U.S. Provisional Patent Application Ser. No. 61/751,599, filed Jan. 11, 2013.

FIELD OF THE INVENTION

The present invention relates generally to creating and imaging nanoscale patterns using long-wavelength photons. Accordingly, the present invention involves using photoswitchable materials that can be toggled in a repeatable fashion between two distinct states by exposure to at least two distinct wavelengths of light. While stepping or scanning a sample in between exposures, illumination patterns that "erase" previous exposures can be designed, thereby creating patterns that are far smaller than that allowed by the diffraction limit.

BACKGROUND

Optical imaging and patterning can be limited by a far-field diffraction limit. The far-field diffraction limit can limit imaging patterns or creating patterns that are spaced by a distance closer than approximately $\lambda/2$, where $\lambda$ is a wavelength of an illumination. In far-field diffraction, a diffraction pattern can be viewed at a long distance from the diffracting object, or the diffraction pattern can be viewed at the focal plane of an imaging lens.

SUMMARY OF THE INVENTION

Technology for sub-diffraction-limited patterning using a photoswitchable recording material is disclosed. One method can include providing a substrate with a photoresist in a first transition state. The photoresist can be configured for spectrally selective reversible transitions between at least two transition states based on a first wavelength band of illumination and a second wavelength band of illumination. An optical device can selectively expose the photoresist to a standing wave with a second wavelength in the second wavelength band to convert a section of the photoresist into a second transition state. The optical device or a substrate carrier securing the substrate can modify the standing wave relative to the substrate to further expose additional regions of the photoresist into the second transition state in a specified pattern. The method can further convert either the first transition state or the second transition state of the photoresist into an irreversible state, while one of the first transition state and the second transition state of the photoresist remains in a reversible transition state. The photoresist can be developed to remove the regions of the photoresist in the irreversible transition state.

In another example, a system can be used for sub-diffraction-limited patterning using a photoswitchable photoresist. The system can include a substrate carrier, an imaging module, a locking module, and a developing module. The substrate carrier can be configured to position a substrate with a photoresist at a relative position to the imaging device. The imaging module can be configured to generate photons with a first wavelength in a first wavelength band to convert a photoresist into a first transition state, and generate a standing wave with a second wavelength in a second wavelength band to convert a section of the photoresist into a second transition state. The photoresist can be configured for spectrally selective reversible transitions between at least two transition states based on the first wavelength band of illumination and the second wavelength band of illumination. The locking module can be configured to convert the first transition state of the photoresist into an irreversible transition state. The second transition state of the photoresist remains in a reversible transition state. The developing module can be configured to remove the regions of the photoresist in an irreversible transition state.

In another configuration, an optical imaging device can be configured for sub-diffraction-limited patterning. The optical imaging device can include an illumination module and a substrate carrier. The illumination module can be configured to: generate photons with a first wavelength in a first wavelength band to convert a photoresist into a first transition state, and generate a standing wave with a second wavelength in a second wavelength band to convert a section of the photoresist into a second transition state. The photoresist can be configured for spectrally selective reversible transitions between at least two transition states based on the first wavelength band of illumination and the second wavelength band of illumination. The substrate carrier can be configured to position a substrate with the photoresist at a fixed relative position to the illumination module.

There has thus been outlined, rather broadly, the more important features of the disclosure so that the detailed description that follows may be better understood, and so that the present contribution to the art may be better appreciated. Other features of the disclosure will become clearer from the following detailed description of the disclosure, taken with the accompanying drawings and claims, or may be learned by the practice of the disclosure.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure.

FIGS. 1A-1J are illustrations of sub-diffraction-limited patterning using photoswitchable materials in accordance with an example.

FIGS. 6A-6I are illustrations of patterning dense features in two dimensions (2D) using photoswitchable materials in accordance with an example.

FIG. 7A is an illustration of exposing photoswitchable materials over time in accordance with an example.

FIG. 7B is an illustration of exposing photoswitchable materials through a glass slide in accordance with an example.

FIGS. 10A-10B are illustrations of optical systems (or optical imaging devices) for sub-diffraction-limited patterning in two dimensions (2D) in accordance with an example.

Figure 2A:
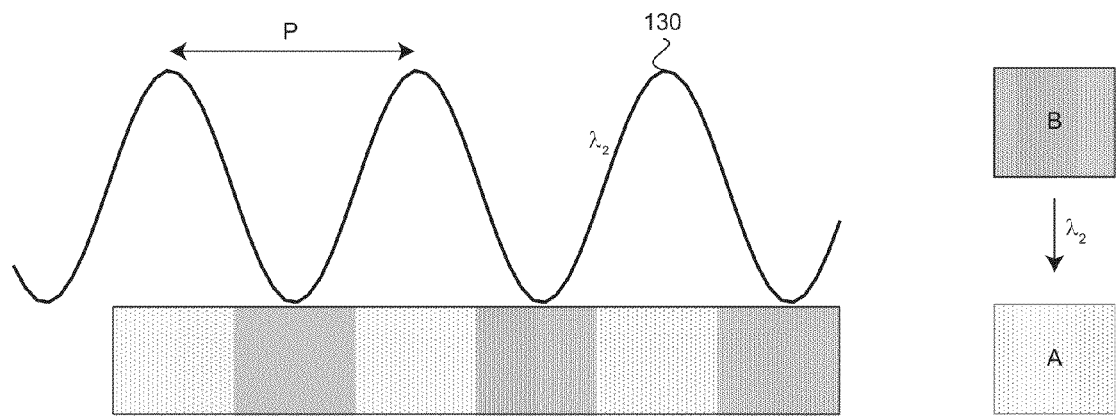
FIGS. 2A-2B are illustrations of shifting a standing wave to reduce the size of an unexposed region used in a pattern in accordance with an example.

These drawings merely depict exemplary embodiments of the disclosure, therefore, the drawings are not to be considered limiting of its scope. It will be readily appreciated that the components of the disclosure, as generally described and illustrated in the figures herein, could be arranged, sized, and designed in a wide variety of different configurations. Nonetheless, the disclosure will be described and explained with additional specificity and detail through the use of the accompanying drawings.

DETAILED DESCRIPTION

It is to be understood that this disclosure is not limited to the particular structures, process steps, or materials disclosed, but is extended to equivalents as would be recognized by those ordinarily skilled in the relevant arts. Alterations and further modifications of the illustrated features, and additional applications of the principles of the examples, which would occur to one skilled in the relevant art and having possession of this disclosure, are to be considered within the scope of the disclosure. It should also be understood that terminology employed herein is used for the purpose of describing particular embodiments only and is not intended to be limiting. The same reference numerals in different drawings represent the same element.

It must be noted that, as used in this specification and the appended claims, the singular forms "a," "an," and "the" include plural referents unless the context clearly dictates otherwise. Thus, for example, reference to "a wave" includes one or more of such elements, reference to "rows" includes reference to one or more of such features, and reference to "exposing" includes one or more of such steps.

DEFINITIONS

In describing and claiming the present disclosure, the following terminology will be used in accordance with the definitions set forth below.

As used herein, "substantial" when used in reference to a quantity or amount of a material, or a specific characteristic thereof, refers to an amount that is sufficient to provide an effect that the material or characteristic was intended to provide. Therefore, "substantially free" when used in reference to a quantity or amount of a material, or a specific characteristic thereof, refers to the absence of the material or characteristic, or to the presence of the material or characteristic in an amount that is insufficient to impart a measurable effect, normally imparted by such material or characteristic.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 0.6 mm to about 0.3 mm" should be interpreted to include not only the explicitly recited values of about 0.6 mm and about 0.3 mm, but also include individual values and sub-ranges within the indicated range. Thus, included in this numerical range are individual values such as 0.4 mm and 0.5, and sub-ranges such as from 0.5-0.4 mm, from 0.4-0.35, etc. This same principle applies to ranges reciting only one numerical value. Furthermore, such an interpretation should apply regardless of the breadth of the range or the characteristics being described.

As used herein, the term "about" means that dimensions, sizes, formulations, parameters, shapes and other quantities and characteristics are not and need not be exact, but may be approximated and/or larger or smaller, as desired, reflecting tolerances, conversion factors, rounding off, measurement error and the like and other factors known to those of skill in the art. Further, unless otherwise stated, the term "about" shall expressly include "exactly," consistent with the discussion above regarding ranges and numerical data.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the disclosure should be determined solely by the appended claims and their legal equivalents, rather than by the descriptions and examples given herein.

Examples of the Invention

The technology (e.g., optical imaging device, methods, processes, computer circuitry, and systems) as described herein provides for creating and imaging nanoscale patterns using long-wavelength photons. Such an approach can be enabled by photoswitchable materials that can be toggled in a repeatable and robust fashion between two distinct states by exposure to two distinct wavelength bands of light or other external stimuli. While stepping or scanning the sample (e.g. substrate with photoswitchable materials) in between exposures, the technology can be used to design illumination patterns that "erase" previous exposures, thereby creating patterns that can be far smaller than the diffraction limit. Such patterns can be "fixed" for patterning or imaged for microscopy as described herein.

Diffraction refers to various phenomena which occur when a wave encounters an obstacle. The diffraction phenomenon can be described as the apparent bending of waves around small obstacles and the spreading out of waves past small openings. Diffractive effects can occur when a light wave travels through a medium with a varying refractive index (e.g., air or a transparent substrate). Diffraction can occur with all types of waves, including sound waves and electromagnetic waves, such as visible light, infrared, X-rays, and radio waves.

The resolution of an optical imaging system (e.g., a microscope or optical imaging device) can be limited by various factors, such as imperfections in the lenses, misalignment, or an instrument's theoretical diffraction limit. The diffraction limit can limit the resolution of the optical system due to diffraction. The resolution of a given instrument can be proportional to the size of the instrument's objective, and inversely proportional to the wavelength of the light being observed. Far-field imaging can be used to create images of objects that are large compared to the illumination wavelength where the objects contain fine structure. Far-field imaging can includes biological applications in which cells span multiple wavelengths but contain structures down to the molecular scales. Far-field imaging can also be used in photolithography (or optical lithography) used to fabricate electrical or electrical-mechanical structures (e.g., for computer circuitry). The far-field diffraction limit can be limited by the wavelength ($\lambda$) of the light or electromagnetic wave used to generate the image.

Aspects of the far-field diffraction limit can be reduced by fluorescence switching for microscopy and/or by photo-switchable molecules for lithography. Sub-diffraction-limited patterning using a photoswitchable recording material can extend approaches of fluorescence switching for microscopy by photo-switchable molecules for lithography with some modification. The technology described herein can simplify the entire process of sub-diffraction-limited patterning with photoswitchable recording materials.

When the distance between an aperture of the imaging device and a plane in which the pattern is observed is large enough (e.g., the difference in phase between the light from the extremes of the aperture is much less than the wavelength of the light), then individual contributions of light can be treated as though the light waves are parallel. Far field can refer to the relatively large distance between the aperture and the plane in which the pattern is observed and can be defined as being located at a distance which is significantly greater than $W^2/\lambda$, where $\lambda$ is the wavelength and W is the largest dimension in the aperture.

FIGS. 1A-1J illustrate examples of a basic scheme of switching the recording material between three states, forms A, B and C. When material in form A absorbs a photon of wavelength $\lambda_1$, the material can turn into form B as illustrated in FIG. 1A. When the material in form B absorbs photon of wavelength $\lambda_2$, the material can turn back to form A. Form B can be selectively converted in an irreversible manner to form C via a "locking" step. Alternatively, in another example, form A can be selectively converted irreversibly to form C, depending on the properties of the resist material. The "locking" step or developing of the photoresist can be achieved using various mechanisms including using a photochemical reaction (see FIGS. 13-15), electrochemical oxidation, chemical oxidation, or dissolving the material away or other means. Those skilled in the art can identify variations of these illustrated reactions. Non-limiting exemplary photoswitchable recording materials are also illustrated following the examples for sub-diffraction limited patterning.

In an example, wavelength $\lambda_1$ can represent a range of wavelengths in a first bandwidth, and wavelength $\lambda_2$ can represent a range of wavelengths in a second bandwidth, where the first bandwidth does not include wavelengths in the second bandwidth, and the second bandwidth does not include wavelengths in the first bandwidth.

FIGS. 1A-1J illustrate a scheme of reactions and/or a sequence of steps a sequence of steps that provides for sub-diffraction limited patterning. In this example, a substrate (not shown) can be coated with the material in form B or the substrate can be coated with a photoswitchable recording material and exposed to wavelength $\lambda_2$ so the material (or substrate) is in form B 110, as shown in FIG. 1A. The substrate can be exposed to a standing wave at $\lambda_2$ 112, which can result in corresponding interspersed regions of B and A, as shown in FIG. 1B. The portions of the substrate exposed to the wave greater than a threshold can be converted to form A, while the portions of the substrate exposed to the wave less than the threshold can remain as form B. The particular shape of the illuminating wave can be substantially different as long the illuminating wave results in some interspersed pattern of form A within form B. FIGS. 1A-1J illustrate a one-dimensional (1D) representation of the process for simplicity of the basic concept of sub-diffraction limited patterning. However, the illustrated process can be and most often will be applied to two-dimensional (2D) and three-dimensional (3D) processes. The substrate can be moved relative to the illumination by change in distance $\Delta_1$ and the exposure can be repeated 114, as shown in FIG. 1C. Alternatively, the wave source and/or waveform (e.g., frequency or phase shift $\Delta_1$) can be altered such that different regions are exposed 114. A second illumination can be similar to step 112, but shifted so sub-diffraction-limited regions of B are interspersed in A as shown in FIG. 1C. The width of the B region can be approximately given by $P/2-\Delta_1$ in this example, where P is the period of the standing wave and $\Delta_1$ is the shift of the standing wave (e.g., less than P/2) between a first exposure of the standing wave and a second exposure of a standing wave. A "locking" mechanism can be used to convert remaining B regions to C 116 as shown in FIG. 1D.

A uniform exposure to $\lambda_1$ 118 can convert the material (or substrate) except those regions that are locked into C (e.g., un-locked material) back into form B, as illustrated in FIG. 1E. The sample (or substrate) can be displaced relative to the illumination so as to convert regions surrounding C into A via the standing wave at $\lambda_2$ 120, as illustrated in FIG. 1F. The sample can be displaced relative to the illumination by $\Delta_2$ (using a process similar to the process illustrated with $\Delta_1$) and the exposure to the standing wave at $\lambda_2$ can be repeated 122, as illustrated in FIG. 1G.

The process can result in a small region of B that is placed next to the first C region with a spacing that can be determined primarily by the difference between the displacements $\Delta_1$ and $\Delta_2$. In an example, mechanical displacement can be far more accurate and precise compared to the diffraction limit, so sub-diffraction-limited patterning can be achieved. Again regions in B can be locked to C 124, as illustrated in FIG. 1H. The steps 120-124 can be repeated 126 until the desired pattern geometry is achieved, as illustrated in FIG. 1I. By changing the relative displacement, the spacing between each C region can be changed in an arbitrary manner. Furthermore, although a periodic pattern is shown in this example (FIGS. 1A-1J), any pattern (non-periodic or periodic) can be used as long as a pattern of A and B regions can be created. The regions in C can be developed 128 (or dissolved away) to result in topographical patterns, as illustrated in FIG. 1J. In other example (not shown), regions of A or B can be dissolved away while allowing C to remain. Specific choices of which regions to remove or leave in place can depend on factors, such as material properties and processing convenience.

Figure 2B:
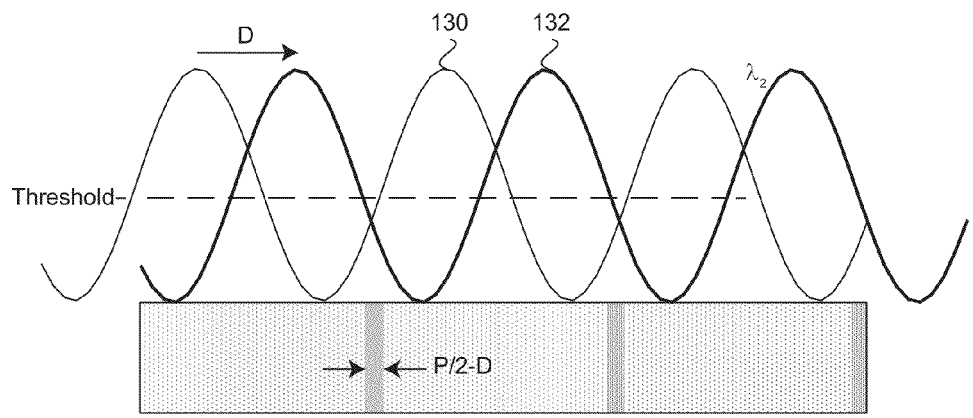

FIGS. 2A-2B illustrate some additional details for steps 112 and 114 of FIGS. 1B-1C for a standing wave 130 at $\lambda_2$. The sample can be displaced relative to the illumination 130 by a distance, D. Then, a second exposure of the standing wave 132 at $\lambda_2$ can convert much of the B to A except for a small region can remain as B, as illustrated in FIG. 2B. By making D close to P/2, substantially narrow regions of B can be formed. A simple threshold model for exposure is illustrated for FIGS. 1A-1J and 2A-2B, where those regions that receive energy (dose) higher than the threshold can be completely converted into the A form. While those regions that receive energy (dose) below this threshold, remain in the original form (A or B). In practice, the threshold may not be a discrete value that toggles the sample between form A and form B. A transition region that is a mixture of A and B can exist at the boundaries between the two regions (i.e., A and B regions). The normalized image slope at the pattern boundary can primarily determine this transition region. Improving the image slope of the pattern at the boundary and/or using a thinner layer of the photoswitchable material can make this transition region extremely small. The transition region can be analogous to conventional optical lithography.

Non-limiting examples of suitable mechanical displacement devices include piezoelectric transducers, stepper motor stages, flexure stages, and the like. Although mechanical displacement can often allow for extreme accuracy (i.e., errors less than 1 nanometer (nm)), any technique can be used for displacing or shifting the standing wave can be used. Such methods can include mechanical displacement of the substrate, mechanical displacement of the wave source, and/or waveform manipulation. The waveform modification can often allow for faster transitions, while less accuracy may occur. These methods can be optimized based on requirements and can use one or more of such wave displacement techniques. FIG. 2B illustrates that by shifting the standing wave, the size of the regions that are in B form can be reduced.

Figure 3:
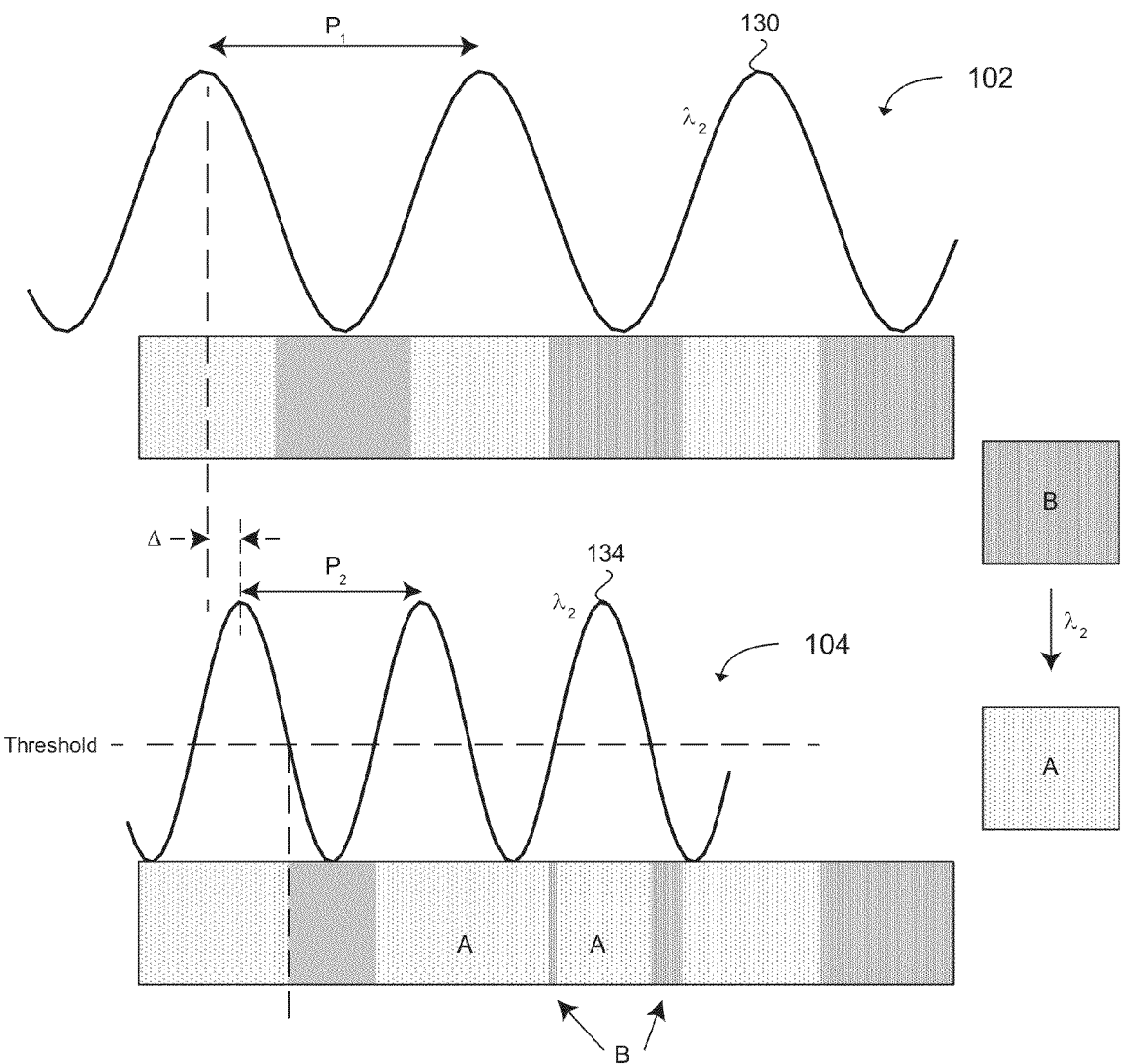
FIG. 3 is an illustration of adjusting a period and relative phase between two illuminations to create patterns of various sizes in accordance with an example.

FIG. 3 illustrates creating patterns of various sizes by adjusting the period and/or the relative phase of the standing wave, which can result in creating patterns with many different linewidths in one exposure-displacement-exposure cycle. In this example, the illumination can be constrained to standing waves 130 and 134, which can relatively easy to generate and illustrate. But any other periodic or non-periodic waveform (or set of waveforms) can also be used. In the example shown in FIG. 3, the periods (e.g., $P_1$ and $P_2$) and the relative phase shift ($\Delta$) can be adjusted between the two illuminations to result in a final pattern that has a combination of very narrow regions and wide regions. The standing waves 130 and 134 can have wavelength band (e.g., $\lambda_2$), such 500 nm to 700 nm. The one exposure-displacement-exposure cycle can include an exposure 102 to standing wave 130 with period $P_1$ displaced from an exposure 104 to standing wave 134 with period $P_2$ by the relative phase shift $\Delta$. Those skilled in the art can appreciate that almost any arbitrary pattern can be decomposed into sinusoids and techniques as illustrated and described can then be applied. The width of the smallest region can be determined by the relative displacement between the exposures.

Figure 4A:
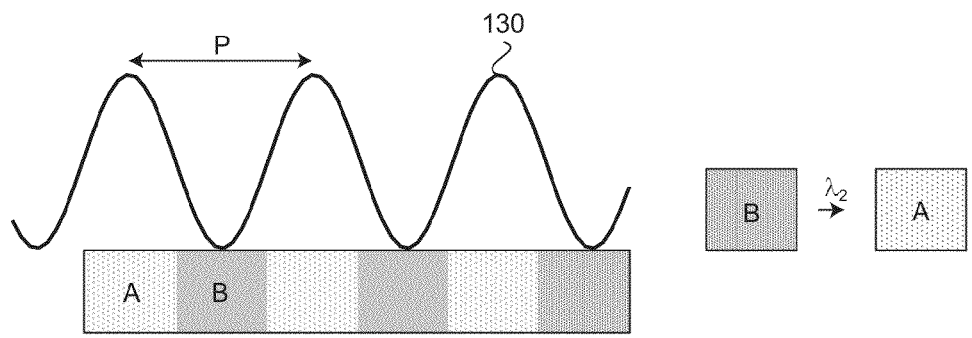
FIGS. 4A-4D are illustrations of adjusting a period without a relative phase displacement between two illuminations to create patterns of various sizes in accordance with an example.
Figure 4B:
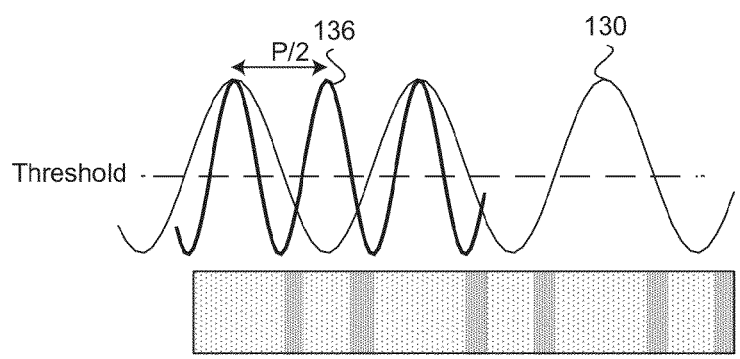
Figure 4C:
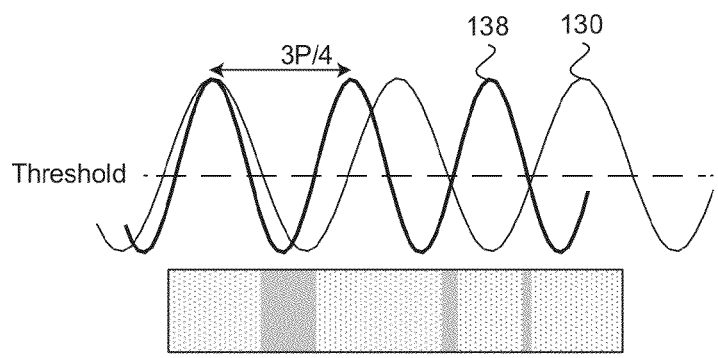
Figure 4D:
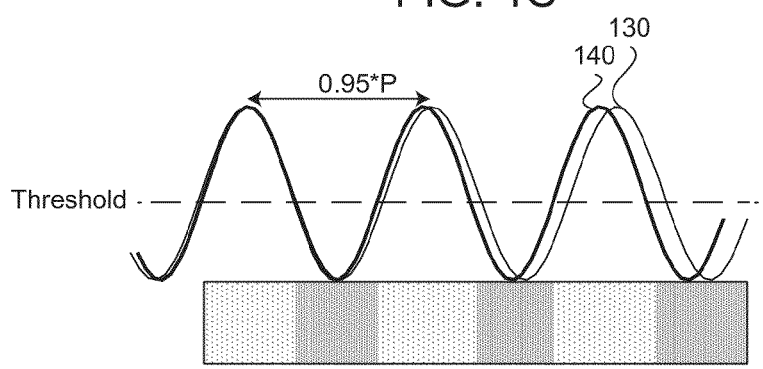

FIGS. 4A-4D illustrates using standing waves of various periods to create complex geometries. In FIGS. 4A-4D, displacement of the substrate is not used. Changing the period (without displacement or phase shifting), as shown, can also result in sub-diffraction-limited features or patterns. In some cases, changing the period rather than moving the substrate relative to the illumination may be easier to perform. FIG. 4A illustrates a standing wave with period P (also shown in FIGS. 1B and 2A). FIG. 4B illustrates that varying the period of a second standing wave 136 with a period P/2 without relative displacement, which can result in sub-diffraction-limited features. FIG. 4C illustrates that varying the period of a second standing wave 138 with a period 3P/4 and the resulting sub-diffraction-limited features, and FIG. 4D illustrates that varying the period of a second standing wave 140 with a period 0.95*P and the resulting sub-diffraction-limited features.

Figure 5A:
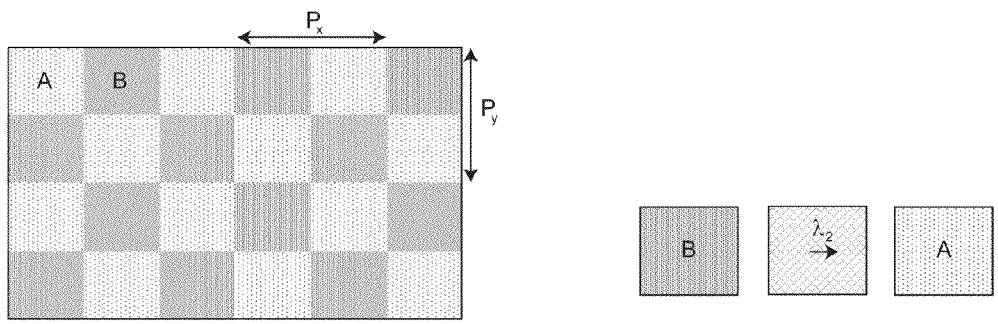
FIGS. 5A-5E are illustrations of patterning two dimensional (2D) geometries using photoswitchable materials in accordance with an example.
Figure 5B:
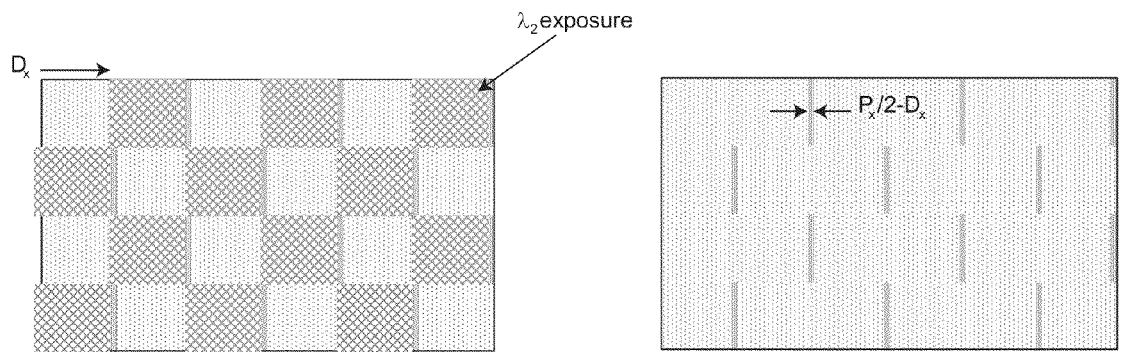
Figure 5C:
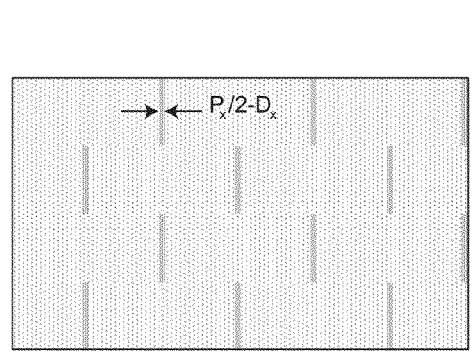
Figure 5D:
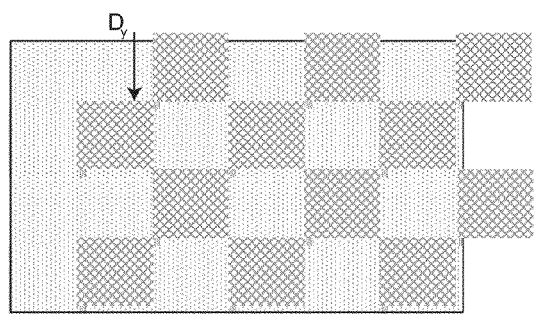
Figure 5E:
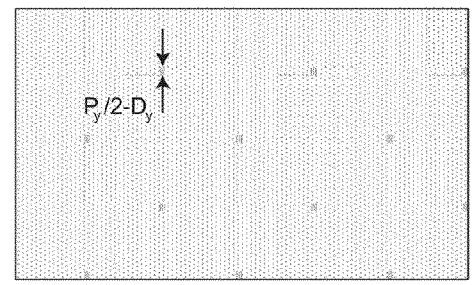

FIGS. 5A-5E shows a method to generate sub-diffraction-limited patterns in two dimensions (2D). In FIG. 5A, a simple checkerboard pattern of A and B can created, which can be achieved by exposing a material in B form to $\lambda_2$ illumination that has a checkerboard intensity distribution to generate A regions (or squares). Px is the period of the standing wave for the checkerboard in the X-direction, and Py is the period of the standing wave for the checkerboard in the Y-direction. FIG. 5B illustrates the substrate displaced relative to the illumination (e.g., $\lambda_2$ exposure) in the X-direction (horizontal) by Dx. The displacement and exposure shown in FIG. 5B can results in narrow strips whose width in the X-direction is Px/2−Dx, as illustrated in FIG. 5C. Next, the sample can be displaced relative to the illumination in the Y or vertical direction by Dy, as illustrated in FIG. 5D. After exposure in the Y-direction, narrow points of B can result. The size of the narrow points of B can be approximately given by (Px/2−Dx)×(Py/2−Dy). The resulting points can be arranged in a rhombic lattice. Based on the process shown in FIGS. 5A-5E, any number of regular or irregular patterns can be formed by overlapping and stepwise exposure with varying patterns.

Figure 5F:
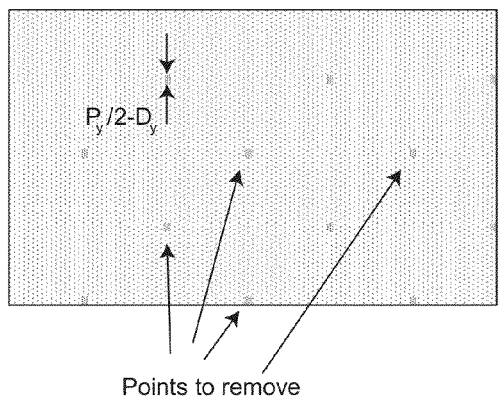
FIGS. 5F-5I are illustrations of removing features of two dimensional (2D) geometries using selective illuminations in accordance with an example.
Figure 5G:
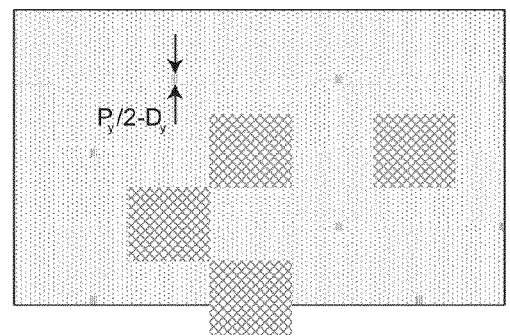
Figure 5H:
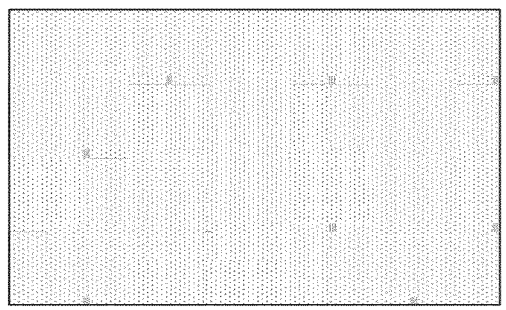
Figure 5I:
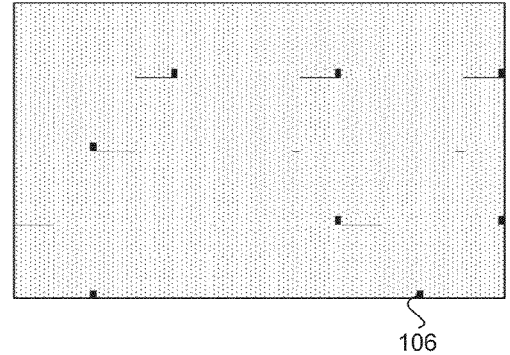

FIGS. 5A-5E illustrate patterning 2D geometries, while FIGS. 5F-5I illustrate removing features of 2D geometries using selective illuminations. FIG. 5F illustrates the points (or features) to be removed. FIG. 5G illustrates selectively exposing regions with the points to be removed with $\lambda_2$ illumination. FIG. 5H illustrates the remaining features of B. Following the sequence of exposures illustrated in FIGS. 5A-5E, 5F-5H, and/or 6A, the lattice of points in the B form can be locked into the C form, as shown in FIG. 5I and/or FIG. 6B.

FIGS. 6A-6I illustrate patterning dense features in 2D. FIG. 6A illustrates a sub-diffraction-limited starting pattern 210 generated from FIGS. 5A-5E. The pattern in the B form can be locked into the C form 212, as shown in FIG. 6B. The process (or method) can be followed by a reset exposure 214 that creates a region of B surrounding the previously locked C regions, as shown in FIGS. 6C and 6D. FIG. 6C illustrates an exposure of the material to standing wave $\lambda_1$ to reset the regions of A. FIG. 6D illustrates resulting pattern 216 of regions of A and regions of B surrounding the previously locked C regions after the reset exposure. The edges (e.g., the bottom and right edges) of the B regions may be chosen carefully as the edges can define the locations of the next exposure points. FIGS. 6E-6H illustrate generating additional 2D features (similar to the 1D features shown in FIGS. 1F-1I). FIGS. 6E-6F illustrate an exposure shifted in the X direction 218 and the resulting pattern 220. FIGS. 6G-6H illustrate an exposure shifted in the Y direction 222 and the resulting pattern 224. FIG. 6I illustrates locking in the pattern 226 of the second set of features with a spacing dx in the x direction and spacing dy in the y direction from the first set of features.

A challenge in patterning with a node (e.g., small locked-in feature 106 of FIG. 5I) using the processes illustrated for 1D and 2D can be that the quality of the pattern can be intimately linked to the darkness of the node (lack of exposure or absorbed energy from the other standing wave (e.g., A exposure for a form B node or B exposure for a form A node)). If noise occurs in the node, then image contrast can suffer, which effect can be illustrated in FIG. 7A where the form B regions can be reduced with an increased exposure time of $\lambda_2$ illumination. As exposure time is increased, the region (e.g., B region) that is supposed to receive no exposure (corresponding to the node of the incident standing wave) can actually receive some noise photons. The noise photons can convert the material from B to A creating a low-contrast image. If the exposure is performed long enough, the chemical image may be completely eliminated 202 from noise. One approach to mitigating the lack of contrast due to noise can be to place the material on the surface of a transparent substrate, such as a quartz or glass slide, as illustrated in FIG. 7B. Then, if the exposures are conducted through the opposite side, even a low-contrast image may be developed to result in narrow topography.

If the standing wave quality is poor, as illustrated in FIG. 7A, image contrast may be deteriorated. The problem of poor image contrast can be solved by exposing through the back of a glass slide, as illustrated in FIG. 7B. The sample can be developed to have the narrow topography 204.

Figure 8A:
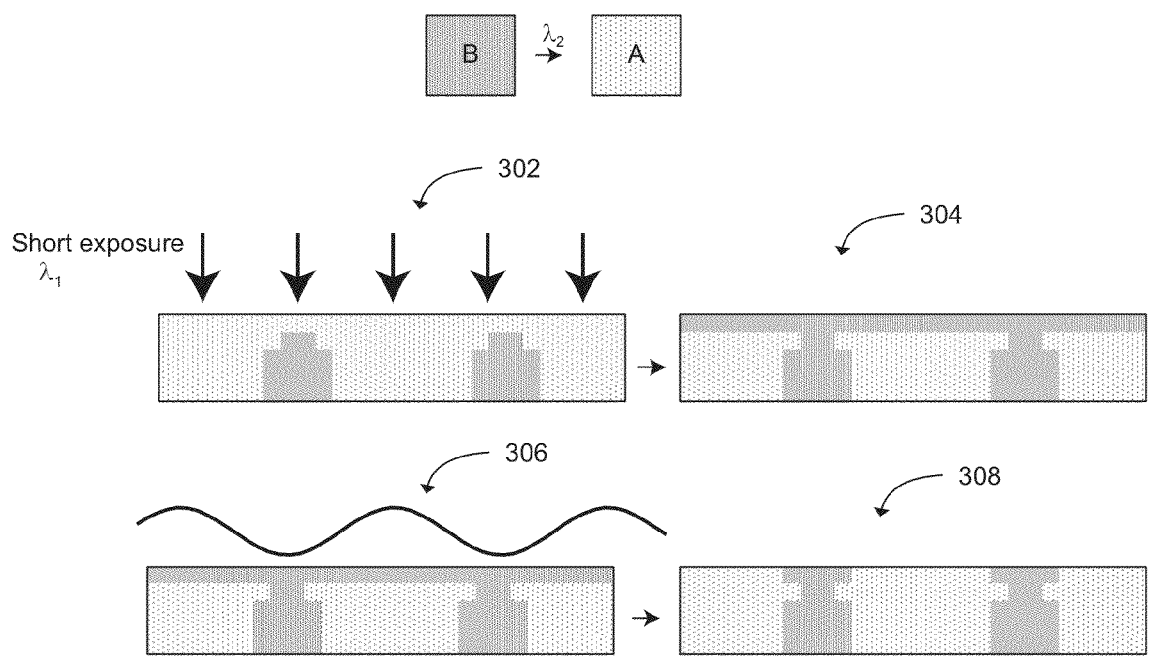
FIGS. 8A-8C are illustrations of increasing an image contrast in accordance with an example.
Figure 8B:
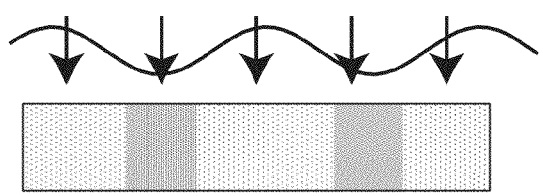
Figure 8C:
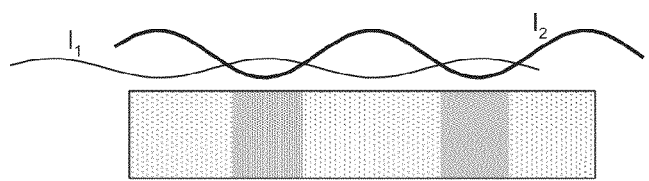

In another example, the problem of low contrast can be solved with a combination of uniform and standing waves of $\lambda_1$ and $\lambda_2$ illumination. For example, a low-contrast image from FIG. 7A can be taken and the sample can be exposed to a uniform beam at $\lambda_1$ for a short time 302 such that a very thin layer at the top surface is converted to B 304, as shown in FIG. 8A. The short exposure of the $\lambda_1$ illumination can be followed with an exposure to a standing wave at $\lambda_2$ 306 to increase the contrast of the final chemical image 308. A similar result can also be achieved by exposing both wavelengths (e.g., uniform $\lambda_1$ illumination and standing wave at $\lambda_2$) simultaneously to the material, as shown in FIGS. 8B and 8C. In FIG. 8C, low intensity $\lambda_1$ illumination $I_1$ can be exposed as a standing wave whose phase is it shifted to that of the standing wave at $\lambda_2$ (e.g., $I_2$).

In another configuration, FIG. 8A illustrates that by exposing the low-contrast image from FIG. 7A to a uniform illumination at $\lambda_1$ for a relatively short period of time, the image contrast increased. FIG. 8B illustrates increasing the image contrast similar to FIG. 8A by exposing both wavelengths (e.g., $\lambda_1$ and $\lambda_2$) simultaneously. FIG. 8C illustrates increasing the image contrast similar to FIG. 8A, where the $\lambda_1$ illumination may also be a standing wave whose phase is it shifted with respect to the $\lambda_2$ standing wave. In the cases illustrated in FIGS. 8B and 8B, the intensities of $\lambda_1$ and $\lambda_2$ can be chosen based on the quantum efficiencies of the respective transformations. Specifically, the rates of conversion between state A and state B can be a function of intensity such that the desired regions can be converted to each state without excess bleed over.

The principles in FIGS. 7A-7B and 8A-8C can be applied to the various methods for generating sub-diffraction-limited patterns, including those methods illustrated in FIGS. 1A-6I, using either a sequential exposure of $\lambda_1$ followed by an exposure of $\lambda_2$ or simultaneously using both wavelengths (e.g., $\lambda_1$ and $\lambda_2$) in an exposure.

Many different optical systems may be utilized to generate sub-diffraction-limited patterns. In one-dimension, a conventional interferometer can be used. An interferometer can make use of the principle of superposition to combine waves (e.g., with wavelengths $\lambda_1$ and $\lambda_2$) in a way that can cause the result of their combination to have some meaningful property.

Figures 9A, 9B, 9C:
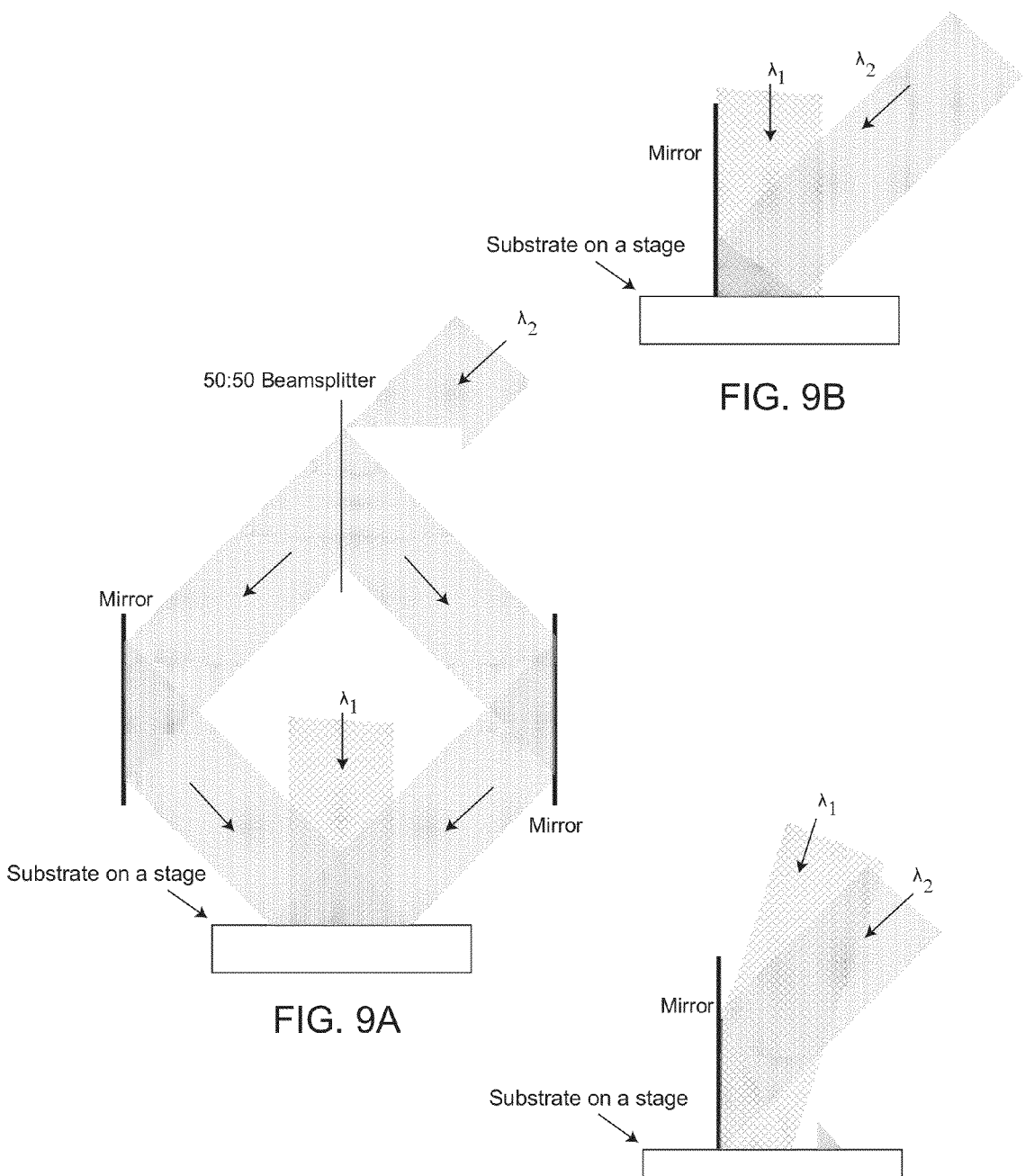
FIGS. 9A-9C are illustrations of optical systems for sub-diffraction-limited patterning in one dimension (1D) in accordance with an example.

FIGS. 9A-9C illustrate several options for generating sub-diffraction-limited patterns using an interferometer. Two wavelengths (or more wavelengths) can be utilized either sequentially or simultaneously. FIG. 9A illustrates a simple Mach-Zehnder configuration of an interferometer with a 50:50 beamsplitter and mirrors. FIG. 9B illustrates a Lloyds-mirror interferometer and FIG. 9C shows a same interferometer used for both beams. The sample can be mounted on a stage to generate dense and arbitrary 1D geometries. Simple 2D geometries can also be achieved by adding a rotational stage and/or a 2D (X–Y) stage, where the stage can be moved in more than one dimension.

An interferometer can superimpose waves, usually electromagnetic waves, to extract information about the waves or expose a surface to a wave with a specified wavelength.

Interferometers can be used for the measurement of small displacements, refractive index changes, surface irregularities, and similar measurements. Thus, FIG. 9 illustrates possible optical systems that can implement the methods described in 1D. Other optical systems may also be used.

FIGS. 10A and 10B illustrate two optical systems that can generate sub-diffraction-limited patterns in 2D. Other optical systems may also be used. A spatial-light modulator (SLM) can be used to create patterns within the $\lambda_2$ beam either in transmission, as shown in FIG. 10A, or in reflection, as shown in FIG. 10B. The optical imaging device 402 in FIG. 10A can include a SLM, polarization-selective beamsplitter, an imaging system (or illumination module) 410, and a substrate carrier 420. The optical imaging device 404 in FIG. 10B can include a relective SLM, a $\lambda/4$ plate to rotate polarization, a polarization-selective beamsplitter, an imaging system (or illumination module) 410, and a substrate carrier 420. When the patterns are generated simultaneously, as in FIG. 8C, time-multiplexing can be used to apply distinct patterns to the two beams (not shown). An imaging system 410 (which can include a microscope objective) can focus the patterns into a small region on the substrate. A similar optical system with a rotating stage (e.g., substrate carrier) may be used for 3D geometries. 3D geometries may also be generated by variations in a time and/or intensity of exposure to $\lambda_1$ and/or $\lambda_2$.

Figure 11:
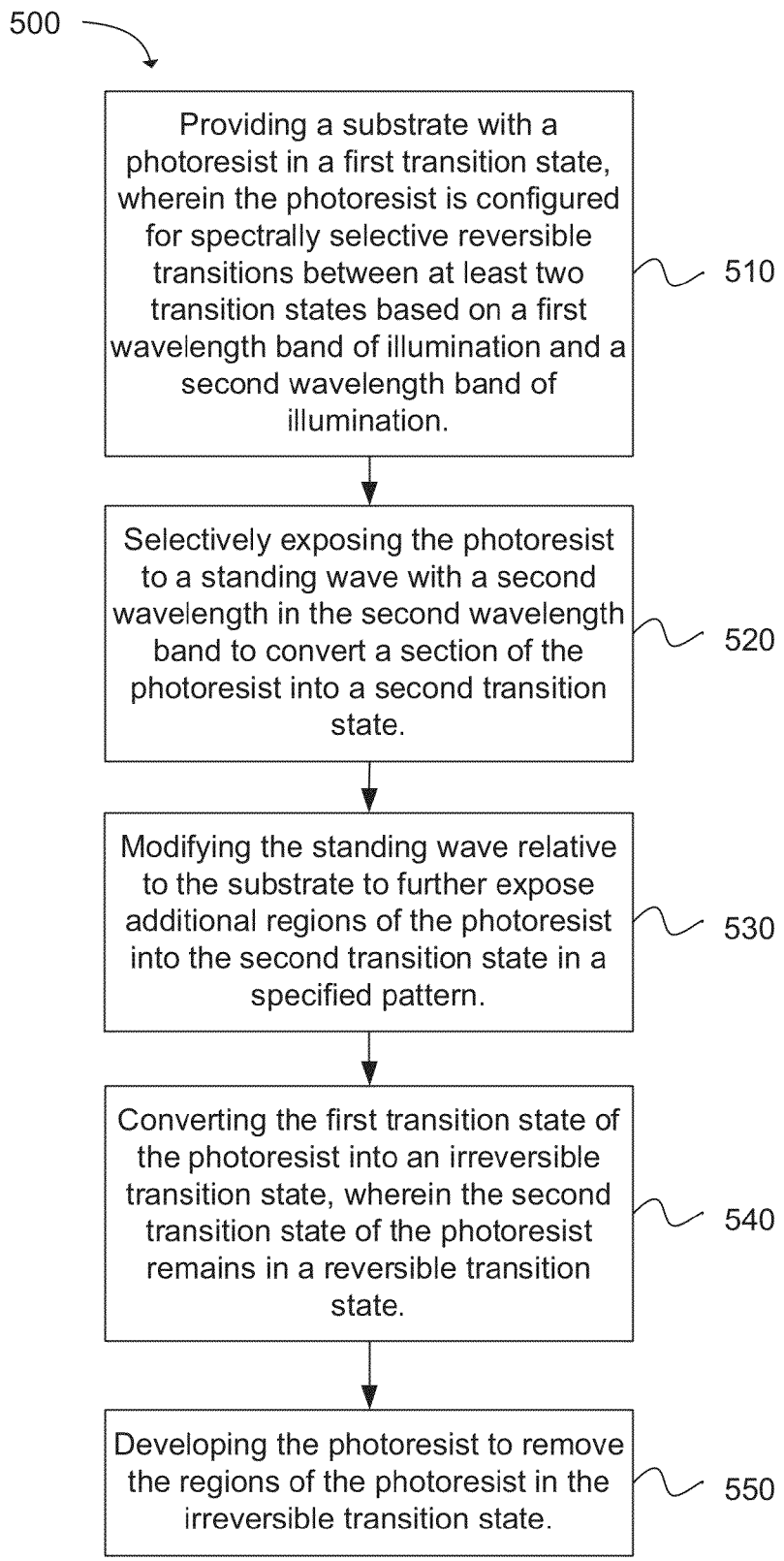
FIG. 11 depicts a flow chart of a method for sub-diffraction-limited patterning using a photoswitchable recording material in accordance with an example.

Another example provides a method 500 for sub-diffraction-limited patterning using a photoswitchable recording material, as shown in the flow chart in FIG. 11. The method may be executed as instructions on a machine, computer circuitry, or a processor, where the instructions are included on at least one computer readable medium or one non-transitory machine readable storage medium. The method includes the operation of providing a substrate with a photoresist in a first transition state, wherein the photoresist is configured for spectrally selective reversible transitions between at least two transition states based on a first wavelength band of illumination and a second wavelength band of illumination, as in block 510. The operation of selectively exposing the photoresist to a standing wave with a second wavelength in the second wavelength band to convert a section of the photoresist into a second transition state follows, as in block 520. The next operation of the method can be modifying the standing wave relative to the substrate to further expose additional regions of the photoresist into the second transition state in a specified pattern, as in block 530. The operation of converting one of the first transition state and the second transition state of the photoresist into an irreversible transition state, wherein one of the first transition state or the second transition state of the photoresist remains in a reversible transition state follows, as in block 540. The method can further include developing the photoresist to remove the regions of the photoresist in the irreversible transition state, as in block 550.

In an example, the operation of providing the substrate with the photoresist in the first transition state can further include: coating a substrate with the photoresist; and uniformly exposing the photoresist to photons with a first wavelength in the first wavelength band to convert the photoresist into the first transition state. In an example, the first wavelength band can be in the range of 250 nanometers (nm) to 400 nm and the second wavelength band can be in the range of 500 nm to 700 nm. In another example, the operation of modifying the standing wave relative to the substrate can further include displacing the substrate relative to an illumination source generating the standing wave. In another configuration, the operation of modifying the standing wave relative to the substrate can further include phase shifting the standing wave. In another example, the operation of modifying the standing wave relative to the substrate can further include modifying the period of the standing wave within the second wavelength band.

In another example prior to converting the first transition state of the photoresist into the irreversible transition state, the method can further include: exposing the photoresist to photons with the first wavelength for a relatively short period of time to convert a surface of the photoresist into the first transition state; and exposing the photoresist to the standing wave with the second wavelength for a relatively short period of time to convert selected regions of a surface of the photoresist into the second transition state to increase image contrast. The operation of converting the first transition state of the photoresist into an irreversible transition state or developing the photoresist can use a photochemical reaction, electrochemical oxidation, chemical oxidation, or dissolving the photoresist away. In another configuration, the photoresist can include a thermally-stable photochromic system containing electroactive moieties, and the operation of converting the first transition state of the photoresist into an irreversible transition state can use a photoactivated reductant or oxidant that generates a redox reaction when exposed to photons with a third wavelength in the third wavelength band. The third wavelength band can differ from the first wavelength band and the second wavelength band. In another example, the photoresist can include bithienylethene (BTE), and the operation of converting the first transition state of the photoresist into an irreversible transition state can use a photooxidant ruthenium tris(bipyridine) dichloride ($Ru(bpy)_3Cl_2$). In another configuration, the operation of selectively exposing the photoresist to the standing wave can convert the photoresist into a second transition state when the energy of the standing wave exceeds a threshold.

Figure 12:
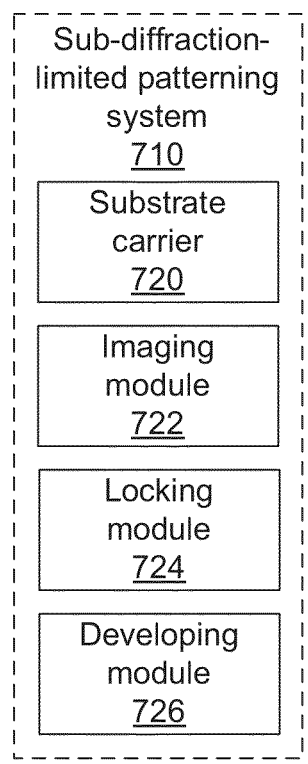
FIG. 12 is an illustration of a system for sub-diffraction-limited patterning using a photoswitchable photoresist in accordance with an example

FIG. 12 illustrates a system 710 for sub-diffraction-limited patterning using a photoswitchable photoresist. The system can include a substrate carrier 720, an imaging module 722, a locking module 724, and a developing module 726. The substrate carrier can be configured to position a substrate with a photoresist at a relative position to the imaging device. The imaging module can be configured to generate photons with a first wavelength in a first wavelength band to convert a photoresist into a first transition state, and generate a standing wave with a second wavelength in a second wavelength band to convert a section of the photoresist into a second transition state. The photoresist can be configured for spectrally selective reversible transitions between at least two transition states based on the first wavelength band of illumination and the second wavelength band of illumination. The locking module can be configured to convert the first transition state of the photoresist into an irreversible transition state. The second transition state of the photoresist remains in a reversible transition state. The developing module can be configured to remove the regions of the photoresist in an irreversible transition state.

In an example, the substrate carrier 720 can be further enabled to move a configurable distance relative to the imaging module 722 or the imaging module can be further enabled to move a configurable distance relative to the substrate carrier to generate a pattern on the photoresist with the standing wave. In another example, the imaging device can be further configured to phase shift the standing wave to generate a pattern on the photoresist with the standing wave. In another configuration, the imaging device can be further configured to modify the period of the standing wave within the second wavelength band to generate a pattern on the photoresist with the standing wave.

In another example, the locking module 724 can be further configured to generate photochemical reaction along with the imaging device, electrochemical oxidation, or chemical oxidation. The first wavelength band can be in the range of 250 nanometers (nm) to 400 nm and the second wavelength band can be in the range of 500 nm to 700 nm.

Referring back to FIGS. 10A-10B, an optical imaging device 402 or 404 can be configured for sub-diffraction-limited patterning. The optical imaging device can include an illumination module 410 and a substrate carrier 420. The illumination module can be configured to: generate photons with a first wavelength in a first wavelength band to convert a photoresist into a first transition state, and generate a standing wave with a second wavelength in a second wavelength band to convert a section of the photoresist into a second transition state. The photoresist can be configured for spectrally selective reversible transitions between at least two transition states based on the first wavelength band of illumination and the second wavelength band of illumination. The substrate carrier can be configured to position a substrate with the photoresist at a fixed relative position to the illumination module.

In an example, the illumination module 410 can include an interferometer configured to generate photons with the first wavelength and the standing wave with the second wavelength, a Mach-Zehnder interferometer, a Lloyds-mirror interferometer, an interferometer with a rotating stage for two dimensional (2D) imaging, or a spatial-light modulator (SLM).

Figure 13:
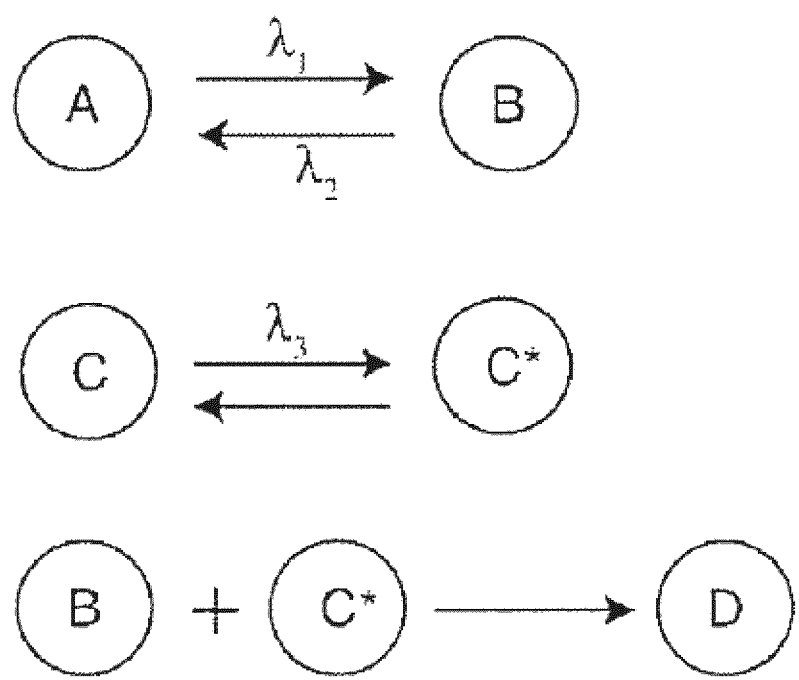
FIG. 13 is an illustration of two-material mixture system used in sub-diffraction-limited patterning in accordance with an example.

Many different materials may be utilized for sub-diffraction-limited patterning. For example, a two-material mixture system can be used. As illustrated in FIG. 13, the material system can include of two molecules, initially in states A and C. When state A is illuminated at wavelength $\lambda_1$, the material can become B (also see FIGS. 1A-1J). When state B is illuminated with $\lambda_2$, the material can transform back to A (also see FIGS. 1A-1J). When the second molecule in state C is illuminated with $\lambda_3$, the material can form an excited state C*. Molecules in state C* and those molecules in state B can react to form a product D. In an example, this reaction may be photocatalyzed. The reaction of formation of D may be irreversible, which can be used to lock the pattern or features, as shown in FIG. 1D, 1H, 1I, 5I, 6B, or 6I. If no molecules in state B are present in the vicinity of C*, the molecules in state C* can relax back to the ground state C when the illumination at $\lambda_3$ is turned off Sufficient molecules of C may be needed to react with B. Otherwise, species starvation may limit the patterning process. States B, C, C* and D may have negligible absorption at $\lambda_1$, states A, C, C* and D may have negligible absorption at $\lambda_2$, and states A, B, C* and D have negligible absorption at $\lambda_3$.

Figure 14:
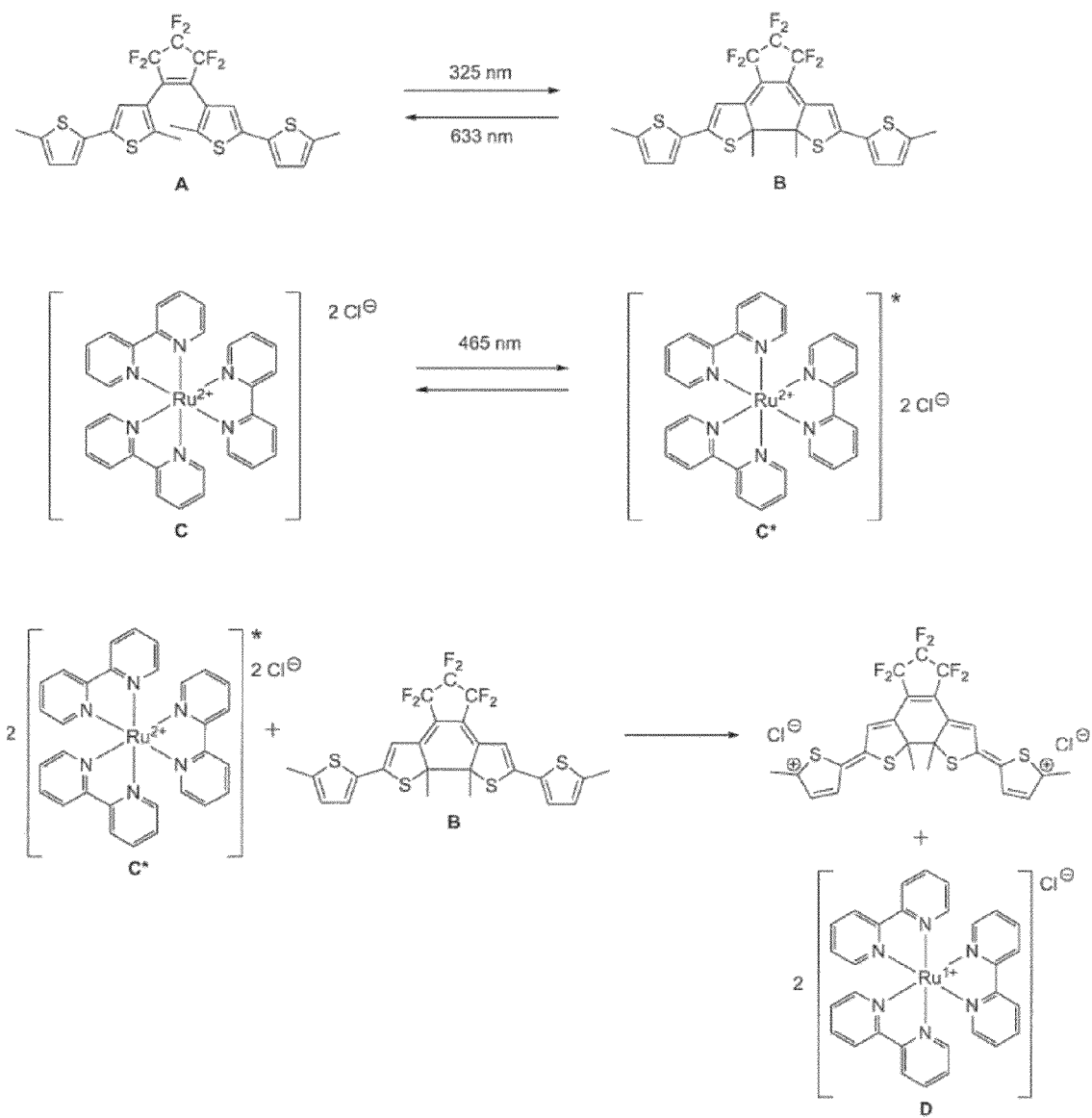
FIG. 14 is an illustration of bithienylethene-ruthenium tris (bipyridine) dichloride materials used in sub-diffraction-limited patterning in accordance with an example.

Materials for single-molecule resolution using a two-material mixture system and three wavelengths are illustrated in FIG. 14. Any thermally-stable photochromic system or molecules (e.g., A/B) containing electroactive moieties can qualify for use in the technology described herein. Specifically, the thermally stable photochromic system can display an increase in conjugation length upon illumination with $\lambda_1$ and, conversely, a decrease in conjugation length upon illumination with $\lambda_2$. In the specific cases detailed in the above examples, bithienylethene (BTE) can serves as the photochromic system. In another example, 1,2-bis(5,5'-dimethyl-2,2'-bithiophen-yl)perfluorocyclopent-1-ene can serve as a photochromic molecule.

Component C can be a photoactivated reductant or oxidant so that a redox reaction does not occur between components A, B and C in the absence of a specific photon input. In the case detailed above, ruthenium tris(bipyridine) dichloride ($Ru(bpy)_3Cl_2$) can serve as a photooxidant. Other non-limiting examples of suitable Component C can include ozone, trans-dioxo complexes of Ruthenium and Osmium, or metal nitrido compounds. A metal-to-ligand charge transfer (MLCT) transition in $Ru(bpy)_3Cl_2$ can be selectively excited at 465 nm, thus creating both a ruthenium center that is a strong electron acceptor and a bipyridine radical anion that can act as an electron donor. Due to the presence of bithiophene moieties in BTE (that can be easily oxidized), the excited $Ru(bpy)_3Cl_2$ can act as a one-electron electron acceptor. However, in state A (or form A), the oxidation potential of the bithiophene arms can be too high for electron transfer to occur. Upon transformation to state B (or form B), however, the oxidation potential of the photochrome can be lowered by approximately 0.5 V and the electron transfer reaction from BTE (B) to $Ru(bpy)_3Cl_2$ can be energetically favorable. The complex product (D) can be preferentially dissolved in methanol after the patterning is completed.

Additionally, BTE (B) can liberate two electrons sequentially to form the stable dication. Thus, the stiochiometry of the redox reaction can use two ruthenium complexes per photochrome.

In another example, one-material mixture system can be used, where a molecule C (including excited state C* and ground state C) is not used to catalyze or photocatalyze the state B into an irreversible state. In a one-material mixture system, a molecule can be converted into an irreversible state or irreversible transformation using an illumination with $\lambda_3$, which differs from $\lambda_1$ and $\lambda_2$. Alternatively, the molecule can be converted into an irreversible state or irreversible transformation using a catalyst or other chemical reaction.

Figure 15:
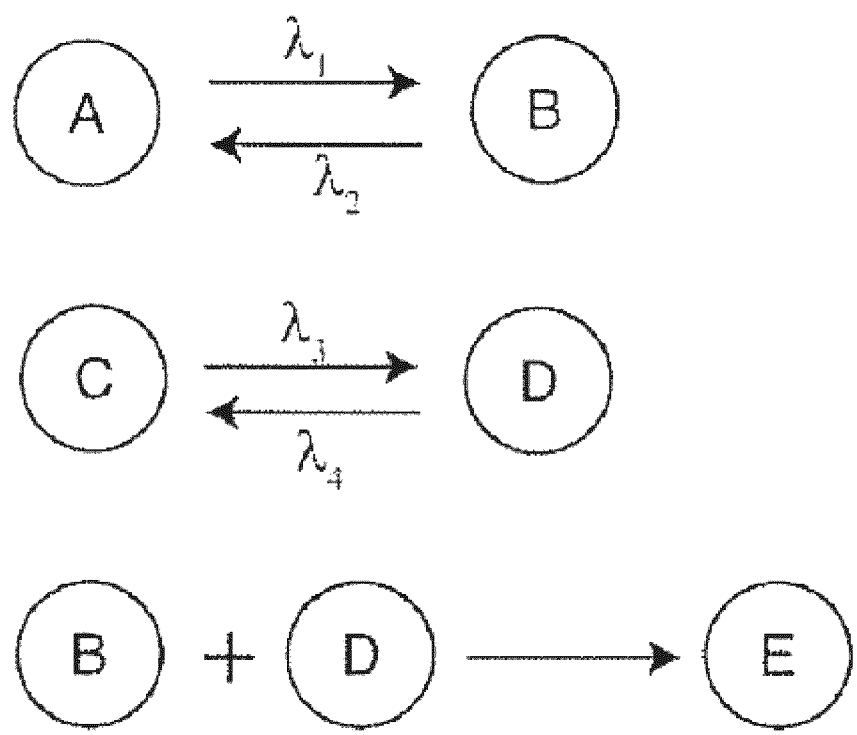
FIG. 15 is an illustration of two-material mixture system used in sub-diffraction-limited patterning where each material undergoes reversible photo-initiated transitions in accordance with an example.

In another example, alternative set of transitions is illustrated in FIG. 15. The system can be a mixture of two different materials. Each material can undergo reversible photo-initiated transitions as described. When molecules in state A are illuminated by $\lambda_1$, the molecules can be converted to state B. The molecules in state B can revert to state A upon illumination by $\lambda_2$. When molecules in state C are illuminated by $\lambda_3$, the molecules can convert to state D. The molecules in state D can revert to state C upon illumination by $\lambda_4$. When molecules in states D and B are in close vicinity, the molecules can undergo an irreversible reaction to form a product E. The reaction of B and D molecules may or may not be photoinitiated. States B, C, D and E can have negligible absorption at $\lambda_1$. States A, C, D and E have negligible absorption at $\lambda_2$. States A, B, D and E can have negligible absorption at $\lambda_3$. States A, B, C, and E can have negligible absorption at $\lambda_4$.

The illumination may not have high intensities. Specific combinations of chemical species can enable patterning, and can be extended to 3-D nanopatterning. The technology can make use of spectrally selective reversible and irreversible transitions, which can be enabled by chemistry. By saturating one of the reversible transitions with an optical node, a single molecule may be retained in one configuration compared to the molecule's neighbors. By using a separate irreversible transformation, the saturated molecule can be fixed using Patterning via Optical-Saturable Transitions (POST).

In an example, polymer systems with absorbance modulation layers (AML) and mass transfer layers (MTL) can be used as photochromes. To achieve nanoscale resolution at low intensities thermally stable classes of photochromes, such as fulgides and diarylethenes, can be used. In both of these classes of photochromes, photoinduced electro cyclic rearrangements can transform a colorless (ultra-violet-absorbing (UV-absorbing)) triene system into a highly colored cyclohexadiene photoproduct, and vice versa. Because covalent bonds can either be formed or broken during the photoisomerization process, conversion between the open-ring and closed-ring isomers can be primarily photoinitiated, and the thermal contribution to this isomerization can be negligible.

Furyl fulgide as the active component in the absorbance modulation layer (AML) reveals a susceptibility to photodegradation that significantly reduces the concentration of this photochrome in the AML with prolonged irradiation. Some fulgides reported in the chemical literature confirms that many fulgides display a lack of fatigue resistance because of photooxidation of either their triene or hetero-cyclic moieties. Therefore, a comparatively photostable class of thiophene-substituted fluorinated cyclopentenes may be used as potential photochromes for absorbance modulation. The perfluorinated bridge in these systems can prevent photooxidation of the active triene moiety and suppress competing nonproductive isomerization pathways. Specifically, BTE can be used in the AML because BTE displays an absorption band centered at 313 nm in the open state (e.g., state A) and one centered at 582 nm in the closed state (e.g., state B). These spectral features allow the use of the 325-nm line of the helium-cadmium laser for the writing beams and the 633-nm line of the helium-neon laser for the confining beams. High intensities can be applied at the nodal wavelength $\lambda_2$ because 633-nm light may have no effect on most photoresists.

Some non-limiting examples of classes of molecules for reversible modulation can include spiropyrans (including spirothiopyrans), chromenes, fulgides, azobenzenes, diarylethene, and viologens. Viologens transition via radical production, which is different from isomerization processes. Spiropyrans can exhibit transitions via ring opening mechanisms. Specific example of suitable absorbance modulation materials can include polymers having azobenzene side-chains, furylfulgides, pyrrolfulgides, and similar absorbance modulation materials. Specific photochromic polymers can include, but are not limited to,

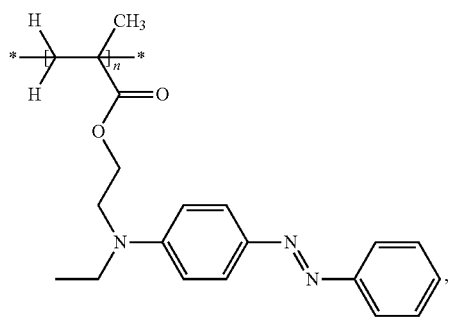

-continued

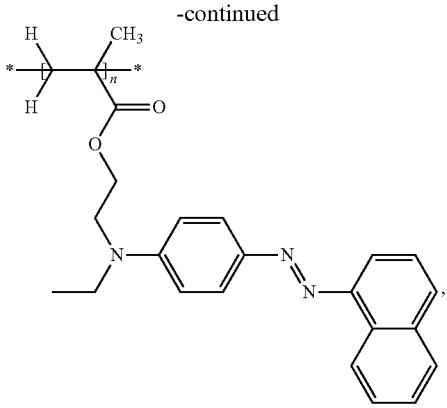

nitro derivatives thereof such as poly[(4-nitrophenyl)[4-[[2-(methacryloyoxy)ethyl]ethylamino]phenyl]diazene] and poly[(4-nitronaphthyl)[4-[[2-(methacryloyoxy)ethyl]ethylamino]phenyl]diazene],

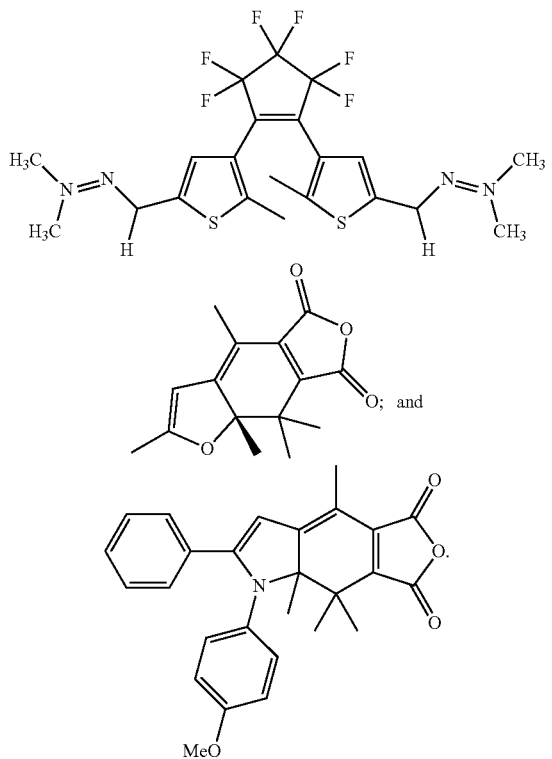

Despite enumeration of several specific absorbance modulation materials, other photochromic materials can be used which exhibit the criteria set forth herein.

Various techniques, or certain aspects or portions thereof, may take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The switch may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A method for sub-diffraction-limited patterning using a photoswitchable recording material, comprising:
    providing a substrate with a photoresist in a first transition state, wherein the photoresist is configured for spectrally selective reversible transitions between at least two transition states based on a first wavelength band of illumination and a second wavelength band of illumination;
    selectively exposing the photoresist to a standing wave with a second wavelength in the second wavelength band to convert a section of the photoresist into a second transition state;
    modifying the standing wave relative to the substrate to further expose additional regions of the photoresist into the second transition state in a specified pattern;
    converting one of the first transition state and the second transition state of the photoresist into an irreversible transition state, wherein one of the first transition state or the second transition state of the photoresist remains in a reversible transition state; and
    developing the photoresist to remove the regions of the photoresist in the irreversible transition state.

2. The method of claim 1, wherein providing the substrate with the photoresist in the first transition state further comprises:
    coating a substrate with the photoresist; and
    uniformly exposing the photoresist to photons with a first wavelength in the first wavelength band to convert the photoresist into the first transition state.

3. The method of claim 1, wherein the first wavelength band is in the range of 250 nanometers (nm) to 400 nm and the second wavelength band is in the range of 500 nm to 700 nm.

4. The method of claim 1, wherein modifying the standing wave relative to the substrate further comprises displacing the substrate relative to an illumination source generating the standing wave.

5. The method of claim 1, wherein modifying the standing wave relative to the substrate further comprises phase shifting the standing wave.

6. The method of claim 1, wherein modifying the standing wave relative to the substrate further comprises modifying the period of the standing wave within the second wavelength band.

7. The method of claim 1, further comprising prior to converting the first transition state of the photoresist into the irreversible transition state:
    exposing the photoresist to photons with the first wavelength for a relatively short period of time to convert a surface of the photoresist into the first transition state; and
    exposing the photoresist to the standing wave with the second wavelength for a relatively short period of time to convert selected regions of a surface of the photoresist into the second transition state to increase image contrast.

8. The method of claim 1, wherein converting the first transition state of the photoresist into an irreversible transition state or developing the photoresist uses a photochemical reaction, electrochemical oxidation, chemical oxidation, or dissolving the photoresist away.

9. The method of claim 1, wherein the photoresist includes a thermally-stable photochromic system containing electroactive moieties, and converting the first transition state of the photoresist into an irreversible transition state uses a photoactivated reductant or oxidant that generates a redox reaction when exposed to photons with a third wavelength in the third wavelength band, wherein the third wavelength band differs from the first wavelength band and the second wavelength band.

10. The method of claim 1, wherein the photoresist includes bithienylethene (BTE), and converting the first transition state of the photoresist into an irreversible transition state uses a photooxidant ruthenium tris(bipyridine) dichloride ($Ru(bpy)_3Cl_2$).

11. The method of claim 1, wherein selectively exposing the photoresist to the standing wave converts the photoresist into a second transition state when the energy of the standing wave exceeds a threshold.

* * * * *